US011527481B2

(12) United States Patent
Chee et al.

(10) Patent No.: US 11,527,481 B2
(45) Date of Patent: Dec. 13, 2022

(54) STACKED SEMICONDUCTOR PACKAGE WITH FLYOVER BRIDGE

(71) Applicant: Intel Corporation, Santa Clara, CA (US)

(72) Inventors: Choong Kooi Chee, Pulau Pinang (MY); Bok Eng Cheah, Pinang (MY); Teong Guan Yew, Pulau Pinang (MY); Jackson Chung Peng Kong, Pinang (MY); Loke Yip Foo, Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 42 days.

(21) Appl. No.: 17/090,933

(22) Filed: Nov. 6, 2020

(65) Prior Publication Data
US 2022/0077070 A1    Mar. 10, 2022

(30) Foreign Application Priority Data

Sep. 4, 2020  (MY) .............................. PI2020004584

(51) Int. Cl.
| | | |
|---|---|---|
| *H01L 23/48* | (2006.01) | |
| *H01L 23/538* | (2006.01) | |
| *H01L 23/31* | (2006.01) | |
| *H01L 21/56* | (2006.01) | |
| *H01L 21/48* | (2006.01) | |

(Continued)

(52) U.S. Cl.
CPC ...... *H01L 23/5385* (2013.01); *H01L 21/4853* (2013.01); *H01L 21/56* (2013.01);
(Continued)

(58) Field of Classification Search
CPC ............. H01L 23/5385; H01L 23/3107; H01L 23/5389; H01L 25/0655
(Continued)

(56) References Cited

U.S. PATENT DOCUMENTS

| | | | | |
|---|---|---|---|---|
| 8,217,502 B2* | 7/2012 | Ko | ..................... | H01L 23/49833 |
| | | | | 257/773 |
| 9,735,131 B2* | 8/2017 | Su | ....................... | H01L 23/5389 |

(Continued)

OTHER PUBLICATIONS

Schor, David; "Intel Introduces Co-EMIB to Stitch Multiple 3D Die Stacks Together, Adds Omni-Directional Interconnects"; https://fuse.wikichip.org/news/2503/intel-introduces-co-emib-to-stitch-multiple-3d-die-stacks-together-adds-omni-directional-interconnects/, retrieved on Oct. 28, 2020; 8 pages; WikiChip LLC.

(Continued)

*Primary Examiner* — Nitin Parekh

(74) *Attorney, Agent, or Firm* — Viering, Jentschura & Partner MBB

(57) ABSTRACT

According to various examples, a device is described. The device may include a package substrate. The device may also include a plurality of semiconductor devices disposed on the package substrate, wherein the plurality of semiconductor devices comprises top surfaces and bottom surfaces. The device may also include a plurality of interconnects coupled to the package substrate, wherein the plurality of interconnects are adjacent to the plurality of semiconductor devices. The device may also include a flyover bridge coupled to the top surfaces of the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate.

17 Claims, 9 Drawing Sheets

(51) Int. Cl.
  *H01L 23/13*   (2006.01)
  *H01L 25/18*   (2006.01)
  *H01L 25/065*  (2006.01)

(52) U.S. Cl.
  CPC .......... *H01L 23/13* (2013.01); *H01L 23/3107* (2013.01); *H01L 23/5389* (2013.01); *H01L 25/0655* (2013.01); *H01L 25/18* (2013.01)

(58) Field of Classification Search
  USPC .................................................. 257/774, 723
  See application file for complete search history.

(56) References Cited

U.S. PATENT DOCUMENTS

| | | | | |
|---|---|---|---|---|
| 2008/0119004 A1* | 5/2008 | Burch | ................... | H01L 21/561 |
| | | | | 438/51 |
| 2010/0059854 A1* | 3/2010 | Lin | ..................... | H01L 21/6835 |
| | | | | 257/E27.114 |
| 2015/0303174 A1* | 10/2015 | Yu | ....................... | H01L 21/6835 |
| | | | | 438/109 |
| 2016/0086930 A1* | 3/2016 | Koey | ................. | H01L 25/0652 |
| | | | | 257/773 |
| 2016/0276325 A1* | 9/2016 | Nair | ..................... | H01L 25/105 |
| 2016/0329272 A1* | 11/2016 | Geissler | ............. | H01L 23/5384 |
| 2020/0098692 A1* | 3/2020 | Lift | .................... | H01L 23/5386 |

OTHER PUBLICATIONS https://www.techpowerup.com/img/ozSUAqhqwcLMPESd.jpg; retrieved on Oct. 28, 2020; 1 page, WikiChip Fuse.

\* cited by examiner ly refer
STACKED SEMICONDUCTOR PACKAGE WITH FLYOVER BRIDGE

CROSS-REFERENCE TO RELATED APPLICATIONS

This non-provisional application claims priority to Malaysian Patent Application No. PI2020004584, which was filed on Sep. 4, 2020, which is incorporated by reference herein in its entirety.

BACKGROUND

Conventional semiconductor packages include embedded components within a package substrate e.g., an embedded silicon bridge or an embedded passive device. However, these embedded components may lead to power delivery network (PDN) discontinuities resulting from the extended power loop inductance between platform voltage regulator and the multiple silicon devices and/or chiplets on the package substrate.

The existing solution to minimize PDN discontinuities includes package footprint expansion due to an increase in real estate required for the passive component e.g., decoupling capacitor placement and associated assembly keep-out zones. However, this results in package mechanical warpage and device reliability challenges. Another solution to minimize PDN discontinuities includes increasing the number of metal-insulator-metal capacitor (MIMCap) to suppress power delivery peak impedance. However, this may result in silicon footprint trade-off and/or assembly throughput.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
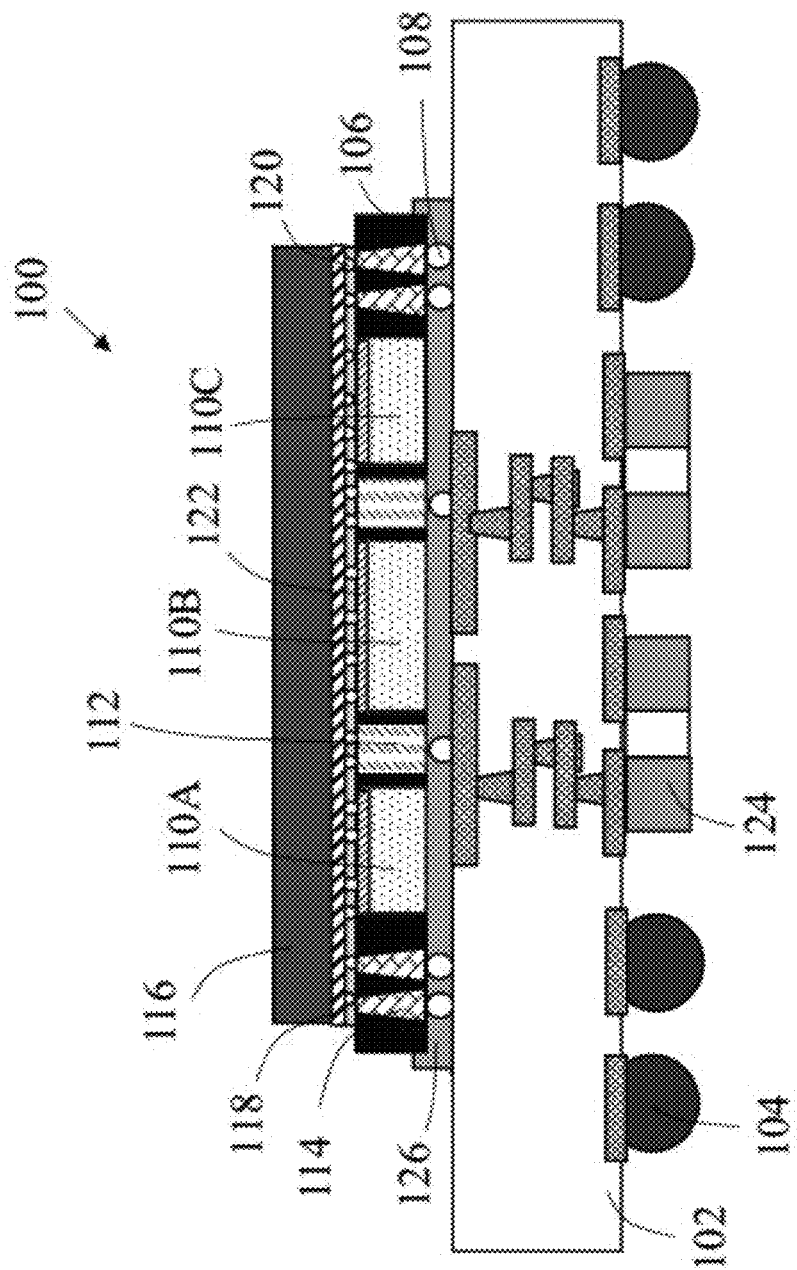
FIG. 1 shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for the present devices, and various aspects are provided for the methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects. An advantage of the present disclosure may include improved power integrity through shorter alternating current (AC) loop inductance and continuous power delivery network through the metal member in the mold layer.

An advantage of the present disclosure may include an improved chiplet-to-chiplet data bandwidth density and signal integrity through miniaturized micro-bump geometry over conventional package micro-via and reduced impedance discontinuities.

An advantage of the present disclosure may include a simplified 2.5D/3D package assembly flow and process operation with superset flyover bridge.

These and other aforementioned advantages and features of the aspects herein disclosed will be apparent through reference to the following description and the accompanying drawings. Furthermore, it is to be understood that the features of the various aspects described herein are not mutually exclusive and can exist in various combinations and permutations.

The present disclosure generally relates to a device. The device may include a package substrate. The device may also include a plurality of semiconductor devices disposed on the package substrate, wherein the plurality of semiconductor devices comprises top surfaces and bottom surfaces. The device may also include a plurality of interconnects coupled to the package substrate, wherein the plurality of interconnects are adjacent to the plurality of semiconductor devices. The device may also include a flyover bridge coupled to the top surfaces of the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate.

The present disclosure generally relates to a method of forming a device. The method may include providing a package substrate. The method may also include positioning a plurality of semiconductor devices over the package substrate, wherein the plurality of semiconductor devices comprises top surfaces and bottom surfaces. The method may also include forming a plurality of interconnects and coupling the plurality of interconnects to the package substrate, wherein the plurality of interconnects are adjacent to the plurality of semiconductor devices. The method may also include forming a flyover bridge and coupling the flyover bridge to the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate.

The present disclosure generally relates to a computing device. The computing device may include a printed circuit board. The computing device may include a semiconductor package coupled to the printed circuit board. The semiconductor package may include a package substrate. The semiconductor package may also include a plurality of semiconductor devices disposed on the package substrate, wherein the plurality of semiconductor devices comprises top surfaces and bottom surface. The semiconductor package may also include a plurality of interconnects coupled to the package substrate, wherein the plurality of interconnects are adjacent to the plurality of semiconductor devices. The semiconductor package may also include a flyover bridge coupled to the top surfaces of the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate.

To more readily understand and put into practical effect, the present device, computing device, method, and other particular aspects will now be described by way of examples and not limitations, and with reference to the figures. For the sake of brevity, duplicate descriptions of features and properties may be omitted.

FIG. 1 shows a cross-sectional view of a semiconductor package according to an aspect of the present disclosure.

In an aspect of the present disclosure, a semiconductor package 100 is shown in FIG. 1. The semiconductor package 100 may be a device. The semiconductor package 100 may be a stacked semiconductor package like a 2.5D or a 3D semiconductor package.

In an aspect of the present disclosure, the semiconductor package 100 may include a package substrate 102. The package substrate 102 may include contact pads, electrical interconnects, routings, and other features, which are not shown in any of the present figures. The package substrate 102 may have one or more rigid core layer for improved structural stability or a coreless substrate package for a reduced form-factor. In other aspects, the package substrate 102 may be part of a larger substrate that supports additional semiconductor packages, and/or components.

In an aspect of the present disclosure, the semiconductor package 100 may include a plurality of solder balls 104. In an aspect, the plurality of solder balls 104 may be disposed on a bottom surface of the package substrate 102. The package substrate 102 may be connected to a motherboard (not shown) through the plurality of solder balls 104. The motherboard may be a PCB. In an aspect, the plurality of solder balls 104 may provide an electrical connection between the package substrate 102, and the motherboard.

In an aspect of the present disclosure, the semiconductor package 100 may include a mold layer 106. In an aspect, the mold layer 106 may be disposed on the package substrate 102. In an aspect, the mold layer 106 may be made from epoxy. In an aspect, the mold layer 106 may be a mold frame. In an aspect, the mold layer 106 may be a single piece or may be made out of several mold pieces. In an aspect, the mold layer 106 may have a top surface and a bottom surface. The bottom surface of the mold layer 106 may be disposed on the package substrate 102.

In an aspect of the present disclosure, the semiconductor package 100 may include a plurality of package bumps 108. The plurality of package bumps 108 may be disposed between the package substrate 102 and the mold layer 106.

In an aspect of the present disclosure, the semiconductor package 100 may include a plurality of semiconductor device 110. In an aspect, the plurality of semiconductor devices 110 may be made from any suitable semiconductor, such as silicon or gallium arsenide. The plurality of semiconductor devices 110 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIG. 1, the plurality of semiconductor devices 110 may be a set of chiplets, which may include a first semiconductor device 110A, a second semiconductor device 110B, and a third semiconductor device 110C.

In an aspect of the present disclosure, the plurality of semiconductor devices 110 may be disposed or embedded in the mold layer 106. In an aspect, the plurality of semiconductor devices may include top surfaces and bottom surfaces. In an aspect, the bottom surfaces of the plurality of semiconductor devices 110 may be electrically isolated from the package substrate 102.

In an aspect of the present disclosure, the semiconductor package 100 may include a plurality of interconnects. In an aspect, the plurality of interconnects may include one or more metal members 112. In an aspect, the one or more metal members 112 may be disposed or embedded in the mold layer 106. In an aspect, the one or more metal members 112 may be disposed between the plurality of semiconductor devices 110. In an aspect, the one or more metal members 112 may be coupled to the package substrate 102 through the plurality of package bumps 108.

In an aspect of the present disclosure, the package substrate 102 is configured to transmit power to the plurality of semiconductor devices 110 through the one or more metal members 112. In an aspect, the one or more metal members 112 may be associated with a voltage reference plane e.g., a power supply reference voltage to facilitate power connection. In an aspect, the one or more metal members 112 may be coupled to a voltage reference network e.g., a power supply rail of the package substrate 102 through the plurality of package bumps 108. In an aspect, a metal member of the one or more metal members 112 may be configured to carry a power (Vcc) reference voltage. In an aspect, another metal member of the one or more metal members 112 may be configured to carry a ground (Vss) reference voltage.

In an aspect of the present disclosure, the one or more metal members 112 may encircle and may interleave with the plurality of semiconductor device 110. In an aspect, the plurality of semiconductor devices 110 are separated by one metal member 112. In an aspect, the one or more metal members 112 may include or may be a single metal frame.

In an aspect of the present disclosure, the plurality of interconnects may include a plurality of through mold vias (TMVs) 114. In an aspect, the plurality of TMVs 114 may be coupled to the package substrate. In an aspect, the plurality of TMVs 114 may be disposed or embedded in the mold layer 106. The plurality of TMVs 114 may extend from a first surface of the mold layer 106 to a second surface of the mold layer 106. The plurality of TMVs 114 may be adjacent to the plurality of semiconductor devices 110. In an aspect, the plurality of TMVs 114 may carry electrical signals e.g., a high-speed I/O signal or a single-ended signal. In another aspect, the plurality of TMVs 114 may be configured to carry a reference voltage e.g., a ground reference voltage (Vss) and/or a power supply reference voltage (Vcc).

In an aspect of the present disclosure, the semiconductor package 100 may include a flyover bridge 116. In an aspect, the flyover bridge 116 may be a silicon bridge, a glass bridge, an organic bridge, or a ceramic bridge. In an aspect, the flyover bridge 116 may be disposed on the mold layer 106, e.g., on the top surface of the mold layer 106. In an aspect, the flyover bridge 116 may be coupled to the top surfaces of the plurality of semiconductor devices 110. In an aspect, the flyover bridge may be directly coupled to the package substrate 102 by the plurality of interconnects such as the one or more metal members 112 and plurality of TMVs 114. In an aspect, the plurality of semiconductor devices 110 is configured to transmit signals to the package substrate 102 through the plurality of TMVs 114 and the flyover bridge 116. In an aspect, the package substrate 102 is configured to transmit power to the plurality of semiconductor devices 110 through the one or more metal members 112 and the flyover bridge 116.

In an aspect, of the present disclosure, the mold layer 106 may have a first length which may be substantially similar to a second length of the flyover bridge 116. In an aspect, the first length of the mold layer 106 may be longer than the second length of the flyover bridge 116.

In an aspect, of the present disclosure, the flyover bridge 116 may include a redistribution layer (RDL) 118. The RDL 118 may include a plurality of conductive traces and/or planes interleaving with a plurality of dielectric layers. In another aspect, the RDL 118 may include a plurality of metal-in-metal (MIM) capacitors disposed in between the plurality of conductive traces and/or planes. In an aspect, the flyover bridge 116 may pass signal I/O from the plurality of TMVs 114 to the plurality of semiconductor devices 110 through the RDL 118. In another aspect, the flyover bridge 116 may facilitate reference voltage connection e.g., a ground reference voltage (Vss) and/or power supply reference voltage (Vcc) from the plurality of TMVs 114 to the plurality of semiconductor devices 110 through the RDL 118.

In an aspect of the present disclosure, the semiconductor package 100 may include a plurality of solder bumps 120. The plurality of solder bumps 120 may be disposed on the mold layer 106. The flyover bridge 116 may be coupled to the plurality of semiconductor devices 110 and/or the plurality of TMVs 114 through the plurality of solder bumps 120.

In an aspect, the plurality of semiconductor devices 110 may include an active layer 122 on each semiconductor device 110. The active layer 122 may include a plurality of conductive traces interleaving with a plurality of dielectric layers. The active layer 122 may be configured to facilitate signal I/O transmission to the package substrate 102 through the flyover bridge 116 and the plurality of TMVs 114. The active layer 122 may be configured to facilitate reference voltage connection e.g., a ground reference voltage (Vss) and/or power supply reference voltage (Vcc) from the package substrate 102 through the flyover bridge 116 and the plurality of TMVs 114.

In an aspect of the present disclosure, the semiconductor package 100 may include a passive device 124. In an aspect, the passive device 124 may be disposed on the bottom surface of the package substrate 102. In an aspect, the passive device 124 may be adjacent to the plurality of solder balls 104. In an aspect, the passive device 124 may be electrically connected to the plurality of semiconductor devices 110. The passive device 124 may be electrically connected to the plurality of semiconductor devices 110 through the one or more metal members 112. In an aspect, depending on package requirements, more than one passive devices 124 may be disposed on the bottom surface of the package substrate 102.

In an aspect of the present disclosure, the semiconductor package 100 may include an underfill layer 126. The underfill layer 126 may be provided to protect the plurality of package bumps 108. The underfill layer 126 may be provided using either a conventional underfilling process or no-flow underfilling process to reduce the effects of thermal expansion and reduce the stress and strain of the plurality of package bumps 108.

In an aspect of the present disclosure, since the flyover bridge 116 and/or the passive device 124 are not embedded, the AC loop inductance between the plurality of semiconductor devices 110 and the passive device 124 may be more direct and/or shorter compared to conventional semiconductor packages with embedded components. As a result, the semiconductor package 100 may have improved power integrity and improved signal integrity.

Figure 2:
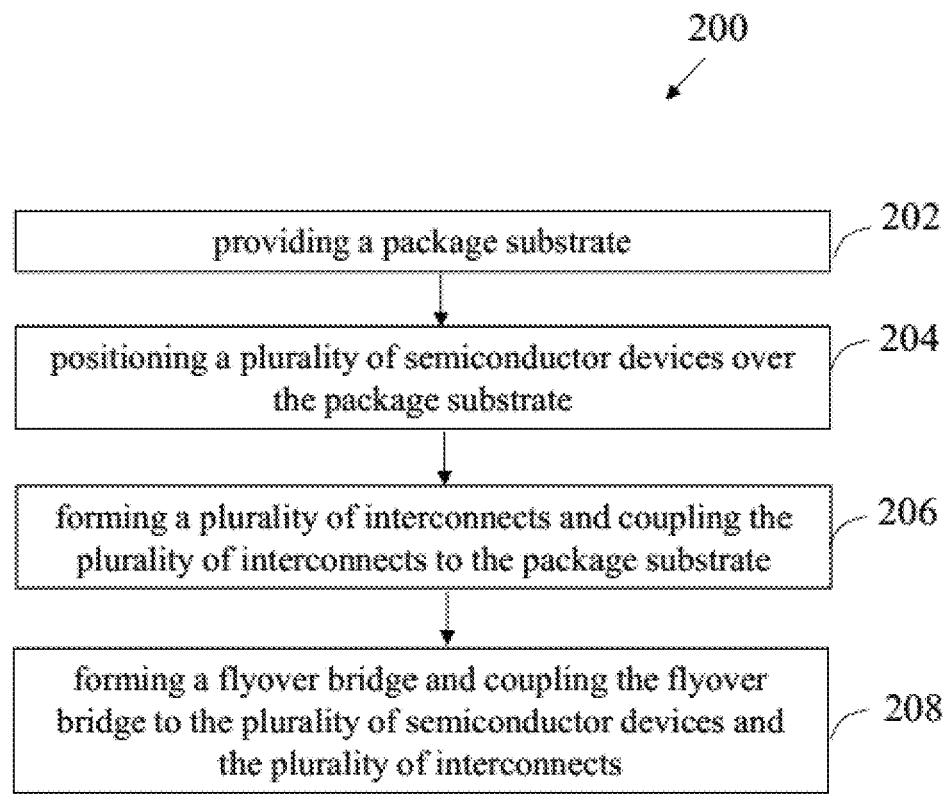
FIG. 2 shows a flow chart illustrating a method of forming a semiconductor package according to an aspect of the present disclosure.

FIG. 2 shows a flow chart illustrating a method of forming a semiconductor package according to an aspect of the present disclosure.

As shown in FIG. 2, there may be a method 200 of forming a device. In the method 200, a first operation 202 may include providing a package substrate. A second operation 204 may include positioning a plurality of semiconductor devices over the package substrate, wherein the plurality of semiconductor devices comprises top surfaces and bottom surfaces. A third operation 206 may include forming a plurality of interconnects and coupling the plurality of interconnects to the package substrate, wherein the plurality of interconnects are adjacent to the plurality of semiconductor devices. A fourth operation 208 may include forming a flyover bridge and coupling the flyover bridge to the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate.

It will be understood that the above operations described above relating to FIG. 2 are not limited to this particular order. Any suitable, modified order of operations may be used.

Figure 3:
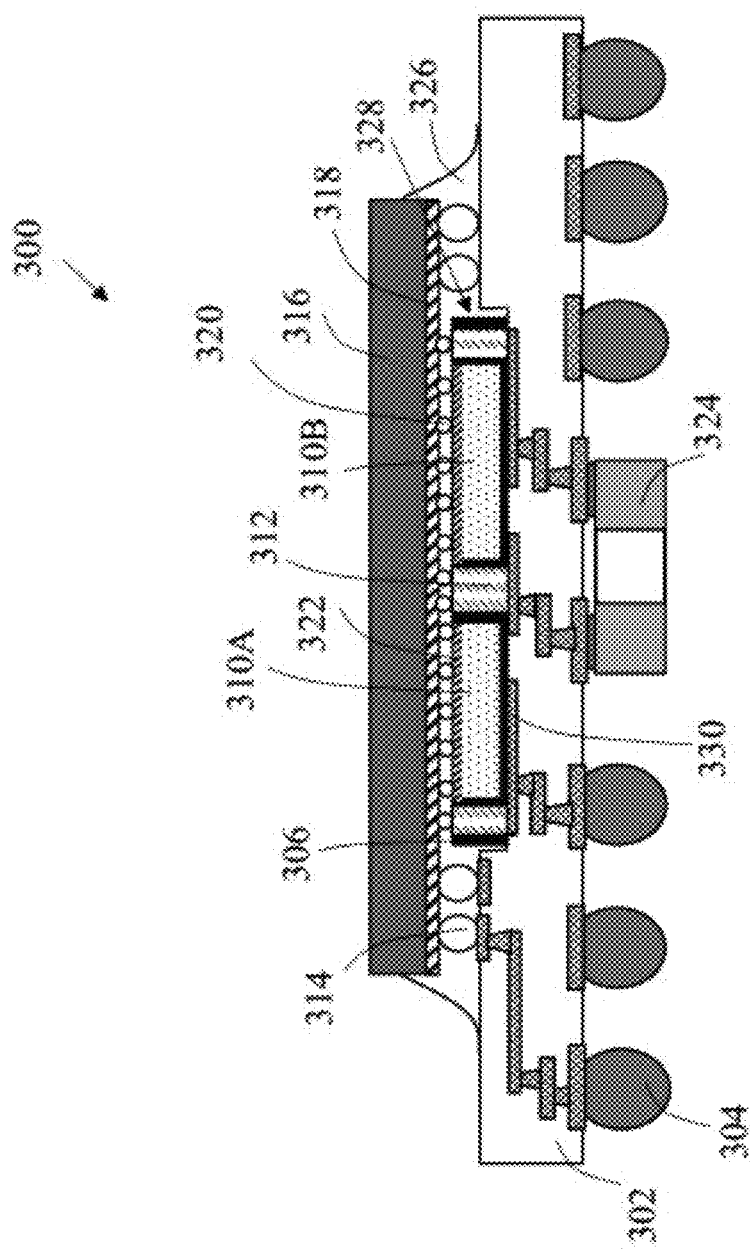
FIG. 3 shows a cross-sectional view of a semiconductor package according to an aspect of the present disclosure.

FIG. 3 shows a cross-sectional view of a semiconductor package according to an aspect of the present disclosure.

In an aspect of the present disclosure, a semiconductor package 300 is shown in FIG. 3. The semiconductor package 300 may be a device. The semiconductor package 300 may be a stacked semiconductor package like a 2.5D or a 3D semiconductor package.

In an aspect of the present disclosure, the semiconductor package 300 may include a package substrate 302. The package substrate 302 may include contact pads, electrical interconnects, routings, and other features, which are not shown in any of the present figures. The package substrate 302 may have one or more rigid core layer for improved structural stability or a coreless substrate package for a reduced form-factor. In other aspects, the package substrate 302 may be part of a larger substrate that supports additional semiconductor packages, and/or components.

In an aspect of the present disclosure, the semiconductor package 300 may include a plurality of solder balls 304. In an aspect, the plurality of solder balls 304 may be coupled to a bottom surface of the package substrate 302. The package substrate 302 may be connected to a motherboard (not shown) through the plurality of solder balls 304. The motherboard may be a PCB. In an aspect, the plurality of solder balls 304 may provide an electrical connection between the package substrate 302, and the motherboard.

In an aspect of the present disclosure, the package substrate 302 may include a recess 328. The recess 328 may be formed on the package substrate 302, e.g., on the top surface of the package substrate 302.

In an aspect of the present disclosure, the semiconductor package 300 may include a mold layer 306. In an aspect, the mold layer 306 may be disposed on the package substrate 302. In an aspect, the mold layer 306 may be disposed on the recess 328. In an aspect, the mold layer 306 may be made from epoxy. In an aspect, the mold layer 306 may be a mold frame. In an aspect, the mold layer 306 may be a single piece or may be made out of several mold pieces. In an aspect, the mold layer 306 may have a top surface and a bottom surface. The bottom surface of the mold layer 306 may be coupled to the package substrate 302. In an aspect, the semiconductor package may include a plurality of contact pads 330 on a bottom surface of the recess 328.

In an aspect of the present disclosure, the semiconductor package 300 may include a plurality of semiconductor device 310. In an aspect, the plurality of semiconductor devices 310 may be made from any suitable semiconductor, such as silicon or gallium arsenide. The plurality of semiconductor devices 310 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIG. 3, the plurality of semiconductor devices 310 may be a set of chiplets, which may include a first semiconductor device 310A, and a second semiconductor device 310B.

In an aspect of the present disclosure, the plurality of semiconductor devices 310 may be disposed or embedded in the mold layer 306. In an aspect, the plurality of semiconductor devices may include top surfaces and bottom surfaces. In an aspect, the bottom surfaces of the plurality of semiconductor devices 310 may be electrically isolated from the package substrate 302.

In an aspect of the present disclosure, the semiconductor package 300 may include a plurality of interconnects. In an aspect, the plurality of interconnects may include one or more metal members 312. In an aspect, the one or more metal members 312 may be disposed or embedded in the mold layer 306. In an aspect, the one or more metal members 312 may be disposed between the plurality of semiconductor devices 310. In an aspect, the one or more metal members 312 may be coupled to the package substrate 302 through the plurality of contact pads 330.

In an aspect of the present disclosure, the package substrate 302 is configured to transmit power to the plurality of semiconductor devices 310 through the one or more metal members 312. In an aspect, the one or more metal members 312 may be associated with a voltage reference plane e.g., a power supply reference voltage to facilitate power connection. In an aspect, the one or more metal members 312 may be coupled to a voltage reference network e.g., a power supply rail of the package substrate 302 through the plurality of contact pads 330. In an aspect, a metal member of the one or more metal members 312 may be configured to carry a power (Vcc) reference voltage. In an aspect, another metal member of the one or more metal members 312 may be configured to carry a ground (Vss) reference voltage.

In an aspect of the present disclosure, the one or more metal members 312 may encircle and may interleave with the plurality of semiconductor device 310. In an aspect, the plurality of semiconductor devices 310 are separated by one metal member 312. In an aspect, the one or more metal members 312 may include or may be a single metal frame.

In an aspect of the present disclosure, the plurality of interconnects may include a plurality of package bumps 314. In an aspect, the plurality of package bumps 314 may coupled to the package substrate. In an aspect, the plurality of package bumps 314 may be adjacent to the mold layer 306. In an aspect, the plurality of package bumps 314 may be adjacent to the plurality of semiconductor devices 310. In an aspect of the present disclosure, the plurality of package bumps 314 may carry electrical signals e.g., a high-speed I/O signal or a single-ended signal. In another aspect, the plurality of package bumps 314 may be configured to carry a reference voltage e.g., a ground reference voltage (Vss) and/or a power supply reference voltage (Vcc).

In an aspect of the present disclosure, the semiconductor package 300 may include a flyover bridge 316. In an aspect, the flyover bridge 316 may be a silicon bridge, a glass bridge, an organic bridge or a ceramic bridge. In an aspect, the flyover bridge 316 may be disposed on the mold layer 306, e.g., on the top surface of the mold layer 306. In an aspect, the flyover bridge 316 may be coupled to the top surfaces of the plurality of semiconductor devices 310. In an aspect, the flyover bridge may be directly coupled to the package substrate 302 by the plurality of interconnects such as the plurality of package bumps 314. In an aspect, the plurality of semiconductor devices 310 is configured to transmit signals to the package substrate 302 through the plurality of package bumps 314 and the flyover bridge 316. In an aspect, the package substrate 302 is configured to transmit power to the plurality of semiconductor devices 310 through the one or more metal members 312 and the flyover bridge 316. In an aspect, of the present disclosure, the mold layer 306 may have a first length which may be smaller than a second length of the flyover bridge 316.

In an aspect, of the present disclosure, the flyover bridge 316 may include a redistribution layer (RDL) 318. The RDL 318 may include a plurality of conductive traces and/or planes interleaving with a plurality of dielectric layers. In another aspect, the RDL 318 may include a plurality of metal-in-metal (MIM) capacitors disposed in between the plurality of conductive traces and/or planes. In an aspect, the flyover bridge 316 may pass signal I/O from the plurality of package bumps 314 to the plurality of semiconductor devices 310 through the RDL 318. In another aspect, the flyover bridge 316 may facilitate reference voltage connection e.g., a ground reference voltage (Vss) and/or power supply reference voltage (Vcc) from the plurality of package bumps 314 to the plurality of semiconductor devices 310 through the RDL 318.

In an aspect of the present disclosure, the semiconductor package 300 may include a plurality of solder bumps 320. The plurality of solder bumps 320 may be disposed on the mold layer 306. In an aspect, the flyover bridge 316 may be coupled to the plurality of semiconductor devices 310 through the plurality of solder bumps 320. In an aspect, the flyover bridge 316 may be coupled to the plurality of package bumps 314. In an aspect, the package bump 314 may have a diameter larger than a diameter of the solder bumps 320.

In an aspect, the plurality of semiconductor devices 310 may include an active layer 322 on each semiconductor device 310. The active layer 322 may include a plurality of conductive traces interleaving with a plurality of dielectric layers. The active layer 322 may be configured to facilitate signal I/O transmission to the package substrate 302 through the flyover bridge 316 and the plurality of package bumps 314. The active layer 322 may be configured to facilitate reference voltage connection e.g., a ground reference voltage (Vss) and/or power supply reference voltage (Vcc) from the package substrate 302 through the flyover bridge 316 and the plurality of package bumps 314.

In an aspect of the present disclosure, the semiconductor package 300 may include a passive device 324. In an aspect, the passive device 324 may be disposed on the bottom surface of the package substrate 302. In an aspect, the passive device 324 may be adjacent to the plurality of solder balls 304. In an aspect, the passive device 324 may be electrically connected to the plurality of semiconductor devices 310. The passive device 324 may be electrically connected to the plurality of semiconductor devices 310 through the one or more metal members 312. In an aspect, depending on package requirements, more than one passive devices 324 may be disposed on the bottom surface of the package substrate 302.

In an aspect of the present disclosure, the semiconductor package 300 may include an underfill layer 326. The underfill layer 326 may be provided to protect the plurality of package bumps 314, and the plurality of solder bumps 320. The underfill layer 326 may be provided using either a conventional underfilling process or no-flow underfilling process to reduce the effects of thermal expansion and reduce the stress and strain of the plurality of package bumps 314, and the plurality of solder bumps 320.

In an aspect of the present disclosure, since the flyover bridge 316 and/or the passive device 324 are not embedded, the AC loop inductance between the plurality of semiconductor devices 310 and the passive device 324 may be more direct and/or shorter compared to conventional semiconductor packages with embedded components. As a result, the semiconductor package 300 may have improved power integrity and improved signal integrity.

In an aspect of the present disclosure, since the mold layer 306 is disposed in the recess 328, the z-height profile or thickness of the semiconductor package 300 may be reduced.

FIGS. 4A through 4E show cross-sectional views directed to an exemplary process flow for a method of forming a semiconductor package according to an aspect of the present disclosure.

Figure 4A:
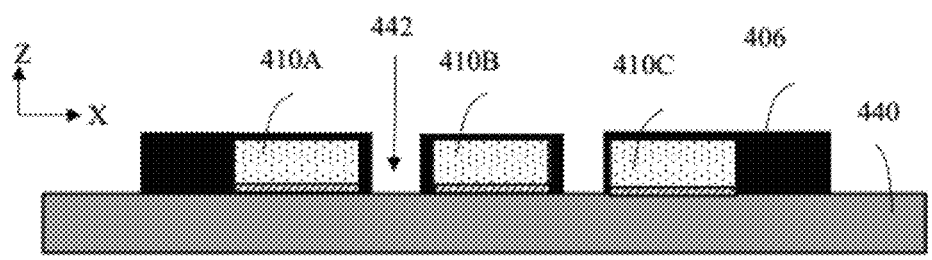
FIGS. 4A through 4E show cross-sectional views directed to an exemplary process flow for a method of forming a semiconductor package according to an aspect of the present disclosure.

As shown in FIG. 4A, a first semiconductor device 410A, a second semiconductor device 410B, and a third semiconductor device 410C are disposed on a processing media 440. The processing media 440 may be a carrier. A mold layer 406 may be disposed around the first semiconductor device 410A, the second semiconductor device 410B, and the third semiconductor device 410C using an injection process and/or a compression molding process. A plurality of first recesses 442 may be formed in the mold layer 406 using an etching process, a laser and/or mechanical drilling process.

Figure 4B:
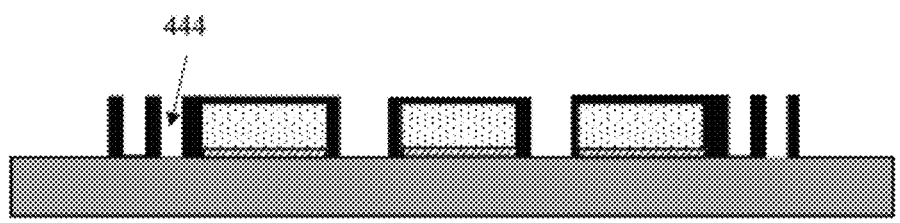

As shown in FIG. 4B, a plurality of second recesses 444 may be formed in the mold layer 406 using laser drilling.

Figure 4C:
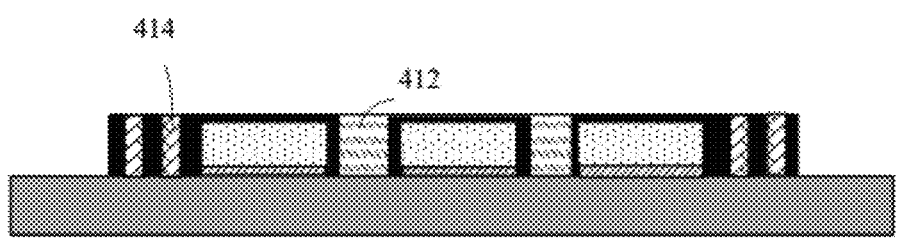

As shown in FIG. 4C, the plurality of first recesses 442 and the plurality of second recesses 444 may be filled with a conductive layer (e.g., metal layer and/or solder paste) using an electroplating process, a printing and/or coating process to form a plurality of metal members 412 and a plurality of TMVs 414. The conductive layer undergoes a grinding and/or a reflow process to produce an even surface.

Figure 4D:
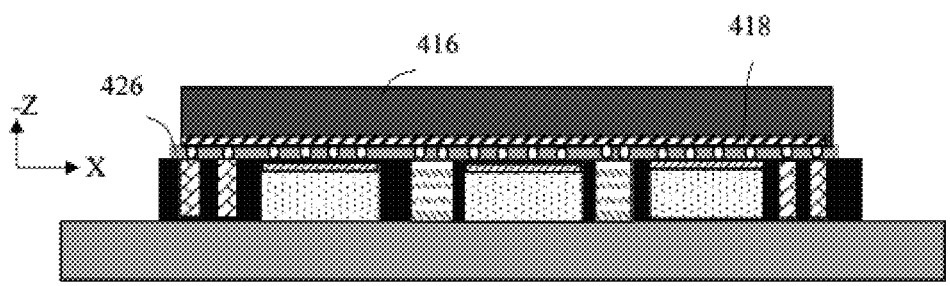

As shown in FIG. 4D, the structure of FIG. 4C may be flipped. A flyover bridge 416 with an RDL 418 may be disposed on the mold layer 406. An underfill layer 426 may be disposed between the flyover bridge 416 and the mold layer 406 to improve mechanical stability.

Figure 4E:
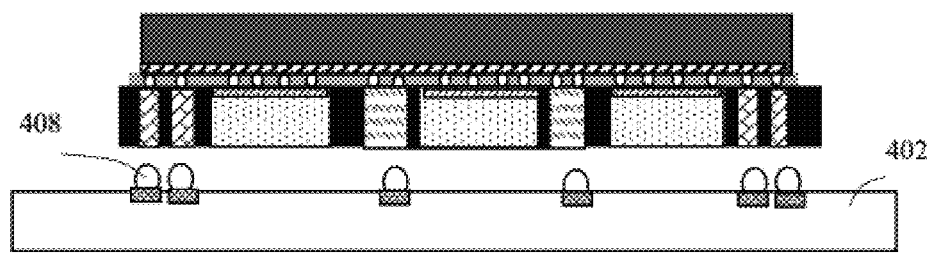

As shown in FIG. 4E, the structure of FIG. 4D may be attached to a package substrate 402 with a plurality of solder bumps 408 using a reflow process to obtain a semiconductor package as disclosed herein.

It will be understood that the exemplary process described above relating to FIGS. 4A through 4E are not limited to this particular order. Any suitable, modified order of operations may be used.

Figure 5:
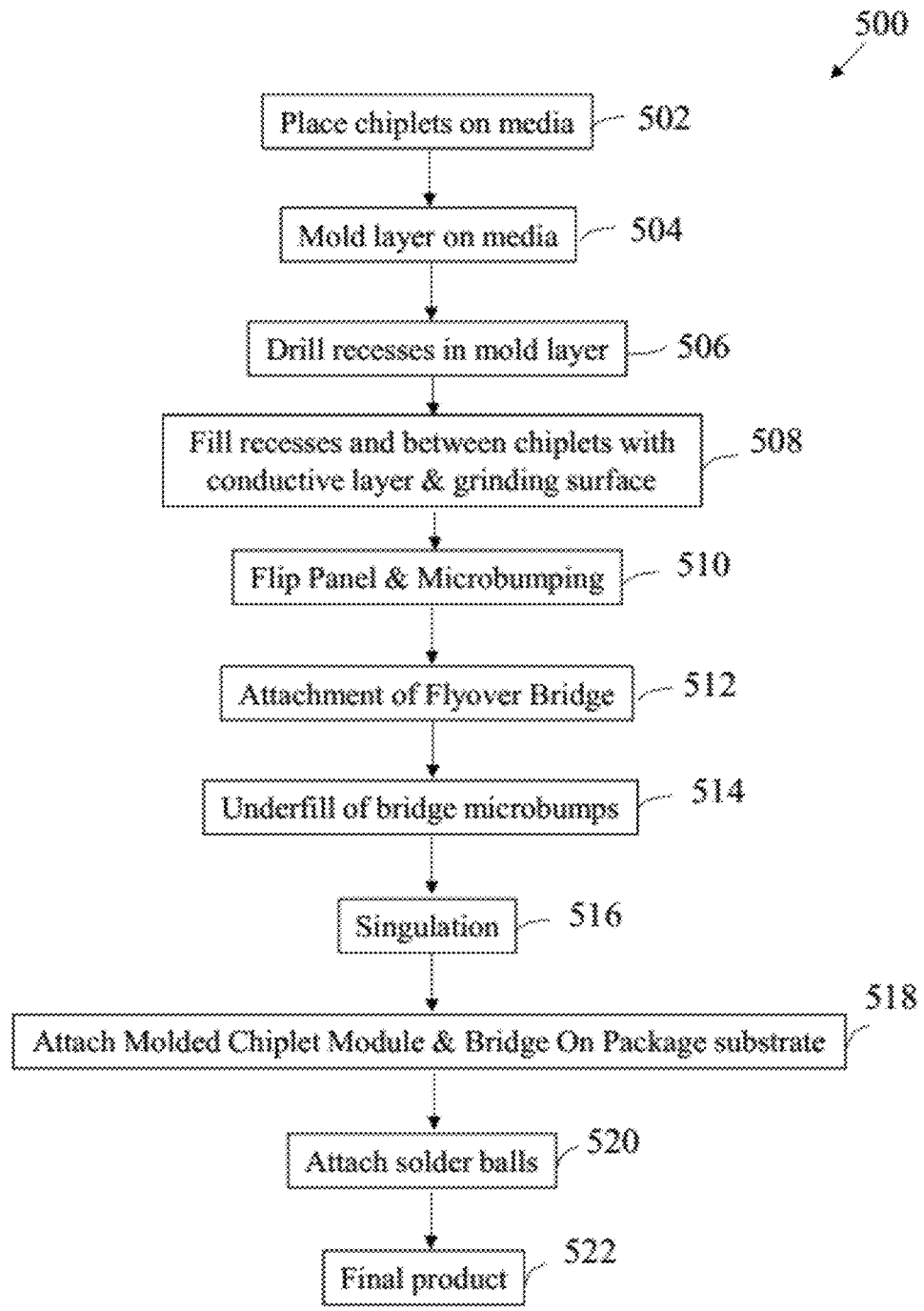
FIG. 5 shows a flow chart illustrating a method of forming the semiconductor package of FIGS. 4A through 4E.

FIG. 5 shows a flow chart illustrating a method of forming the semiconductor package of FIGS. 4A through 4E.

As shown in FIG. 5, there may be a method 500 of forming a semiconductor package. In the method 500, a first operation 502 may include placing a first semiconductor device, a second semiconductor device, and a third semiconductor device on a processing media. A second operation 504 may include placing a mold layer on the processing media according to FIG. 4B. A third operation 506 may include drilling recesses on the mold layer. A fourth operation 508 may include filling the recesses with a conductive layer and grinding conductive layer to have an even surface. A fifth operation 510 may include flipping the structure made in the fourth operation 508 and disposing microbumps on the structure. A sixth operation 512 may include attaching a flyover bridge on the structure made in the fifth operation 510. A seventh operation 514 may include the underfilling of the flyover bridge microbumps. An eighth operation 516 may include a singulation process whereby the structure made in the seventh operation 514 may be divided into multiple identical integrated circuits. A ninth operation 518 may include attaching the molded structure with the flyover bridge on to a package substrate. A tenth operation 520 may include attaching solder balls to the package substrate. In an eleventh operation 522, the semiconductor package of FIG. 4E is produced.

It will be understood that the above operations described above relating to FIG. 5 are not limited to this particular order. Any suitable, modified order of operations may be used.

FIGS. 6A through 6D show cross-sectional views directed to an exemplary process flow for a method of forming a semiconductor package according to an aspect of the present disclosure.

Figure 6A:
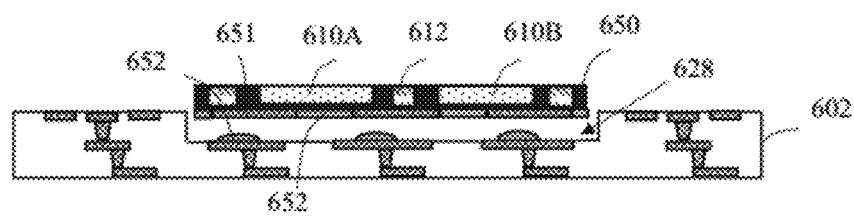
FIGS. 6A through 6D show cross-sectional views directed to an exemplary process flow for a method of forming a semiconductor package according to an aspect of the present disclosure.

As shown in FIG. 6A, solder paste 652 may be disposed in a package recess 628 of a package substrate 602 using a printing process. A molded chiplet module 650 may be disposed in the package recess 628 using a reflow process and/or a thermal compression bonding process. In an aspect, one or more extended planes 651 may be formed on a bottom surface of the molded chiplet module 650 and coupled to one more metal members 612 extending through the molded chiplet module 650. In an aspect, a dielectric layer 653 may be formed to isolate the one or more extended planes 651. In another aspect, a bottom surface of a plurality of semiconductor devices 610A, 610B may be isolated from the one or more extended planes by a mold layer 606.

Figure 6B:
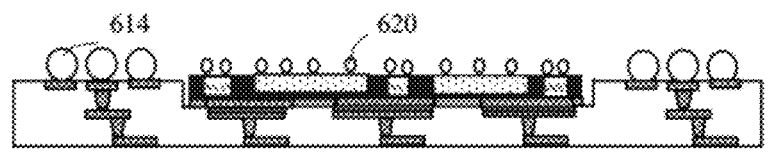

As shown in FIG. 6B, a plurality of package bumps 614 may be disposed on the package substrate 602 using a solder reflow process. A plurality of solder bumps 620 may be disposed on the molded chiplet module 650 using a solder reflow process.

Figure 6C:
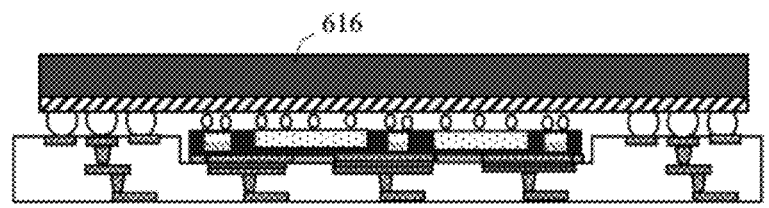

As shown in FIG. 6C, a flyover bridge 616 may be disposed on the plurality of package bumps 614 and the plurality of solder bumps 620 using a solder reflow process.

Figure 6D:
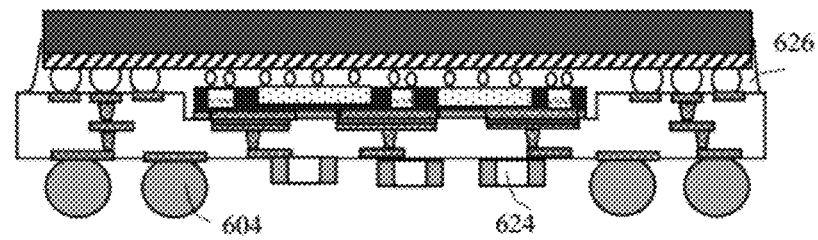

As shown in FIG. 6D, an underfill layer 626 may be disposed to protect the plurality of package bumps 614 and the plurality of solder bumps 620. A plurality of solder balls 604, and one or more passive devices 624 may be disposed on a bottom surface of the package substrate 602.

It will be understood that the exemplary process described above relating to FIGS. 6A through 6D are not limited to this particular order. Any suitable, modified order of operations may be used.

Figure 7:
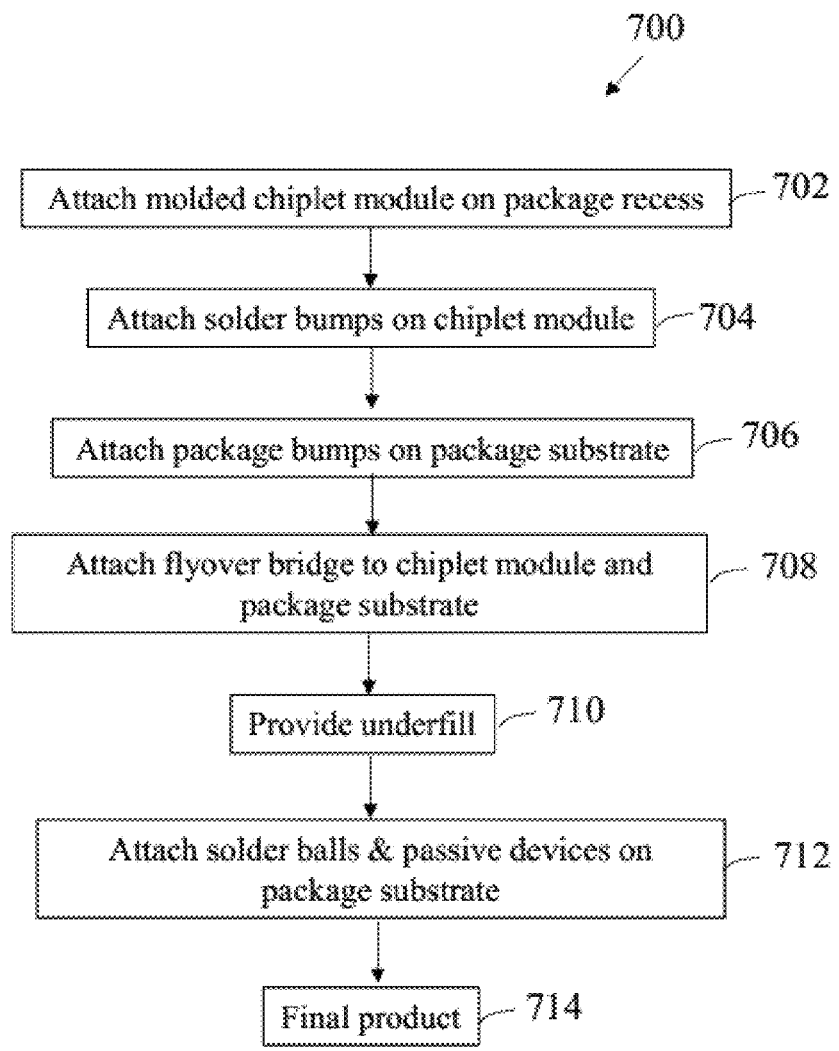
FIG. 7 shows a flow chart illustrating a method of forming the semiconductor package of FIGS. 6A through 6D.

FIG. 7 shows a flow chart illustrating a method of forming the semiconductor package of FIGS. 6A through 6D.

As shown in FIG. 7, there may be a method 700 of forming a semiconductor package. In the method 700, a first operation 702 may include disposing a molded chiplet module on the package recess using a reflow process and/or a thermal compression bonding process. A second operation 704 may include disposing a plurality of solder bumps on the molded chiplet module using a solder reflow process. A third operation 706 may include disposing a plurality of package bumps on the package substrate using a solder reflow process. A fourth operation 708 may include disposing a flyover bridge to chiplet module and package substrate using a solder reflow process. A fifth operation 710 may include disposing an underfill layer to protect the plurality of package bumps and the plurality of solder bumps. A sixth operation 712 may include disposing a plurality of solder balls and one or more passive devices on a bottom surface of the package substrate. In a seventh operation 714, the semiconductor package of FIG. 6D is produced.

It will be understood that the above operations described above relating to FIG. 7 are not limited to this particular order. Any suitable, modified order of operations may be used.

Aspects of the present disclosure may be implemented into a system using any suitable hardware and/or software.

Figure 8:
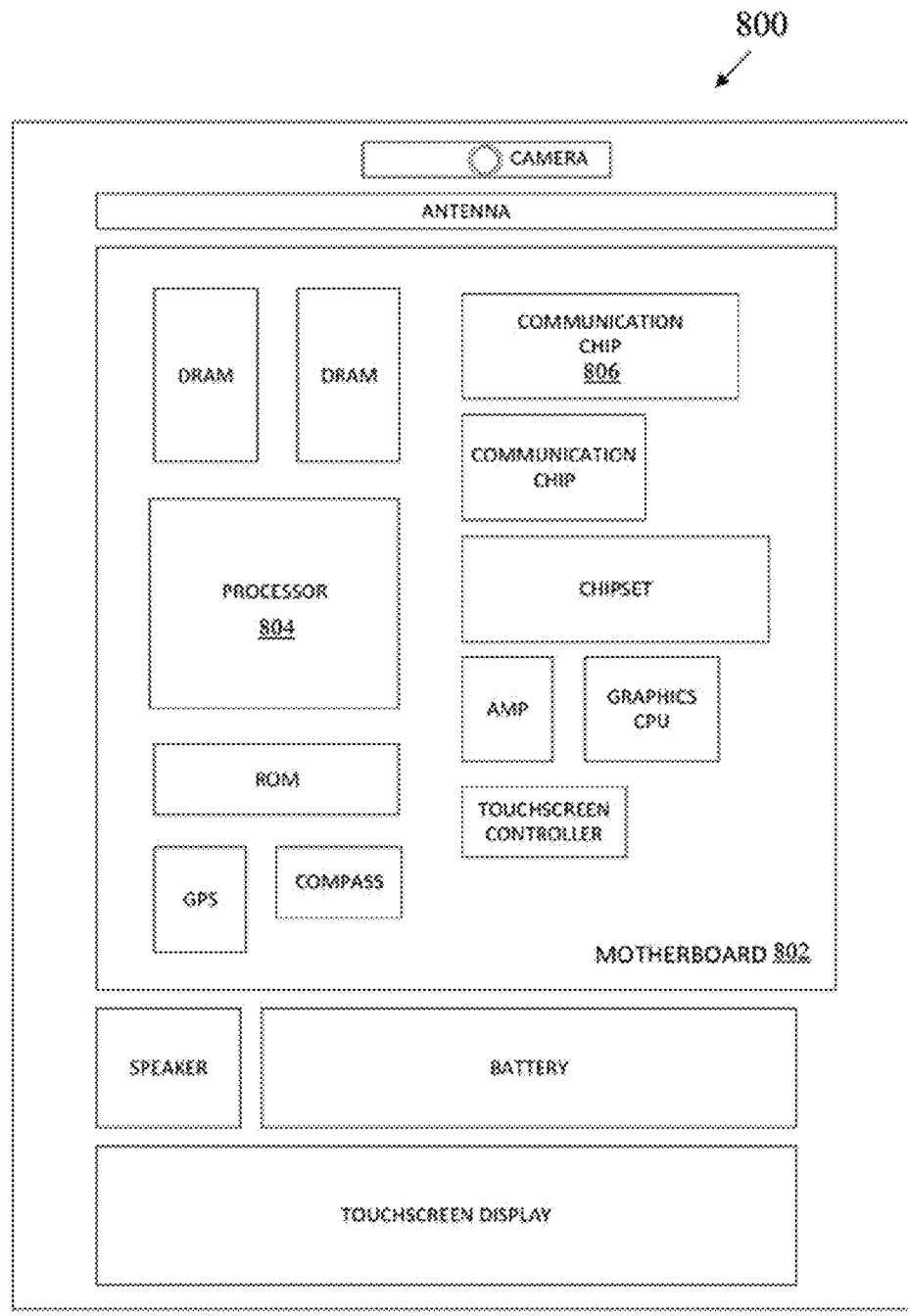
FIG. 8 shows an illustration of a computing device that includes a semiconductor package according to a further aspect of the present disclosure.

FIG. 8 schematically illustrates a computing device 800 that may include a semiconductor package as described herein, in accordance with some aspects.

As shown in FIG. 8, the computing device 800 may house a board such as a motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, the computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 804 of the computing device 800 may be packaged in a semiconductor package, as described herein, and/or other semiconductor devices may be packaged together in a semiconductor package as described herein.

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 806 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 806 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other aspects.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 800 may be a mobile computing device. In further implementations, the computing device 800 may be any other electronic device that processes data.

Examples

Example 1 may include a device including: a package substrate; a plurality of semiconductor devices disposed on the package substrate, in which the plurality of semiconductor devices includes top surfaces and bottom surfaces; a plurality of interconnects coupled to the package substrate, in which the plurality of interconnects are adjacent to the plurality of semiconductor devices; and a flyover bridge coupled to the top surfaces of the plurality of semiconductor devices and the plurality of interconnects, in which the flyover bridge is directly coupled to the package substrate by the plurality of interconnects, and in which the bottom surfaces of the plurality of semiconductor devices are electrically isolated from the package substrate.

Example 2 may include the device of example 1 and/or any other example disclosed herein, further including: a mold layer disposed on the package substrate, in which the plurality of semiconductor devices is disposed in the mold layer.

Example 3 may include the device of example 2 and/or any other example disclosed herein, in which the plurality of interconnects includes one or more metal members disposed in the mold layer, in which the plurality of semiconductor devices are separated by one metal member, and in which the package substrate is configured to transmit power to the plurality of semiconductor devices through the one or more metal members.

Example 4 may include the device of example 3 and/or any other example disclosed herein, in which the plurality of interconnects further includes a plurality of through-mold-vias, in which the plurality of through-mold-vias are disposed in the mold layer, and in which the package substrate is configured to transmit signals to the plurality of semiconductor devices through the plurality of through-mold-vias.

Example 5 may include the device of example 3 and/or any other example disclosed herein, further including: a recess on the package substrate, in which the mold layer with the plurality of semiconductor devices and metal members are disposed in the recess.

Example 6 may include the device of example 5 and/or any other example disclosed herein, in which the plurality of interconnects further includes a plurality of package bumps, in which the plurality of package bumps are positioned adjacent to the mold layer.

Example 7 may include the device of example 3 and/or any other example disclosed herein, further including: a passive device disposed on a bottom surface of the package substrate, in which the passive device is coupled to the one or more metal members.

Example 8 may include a method including: providing a package substrate; positioning a plurality of semiconductor devices over the package substrate, in which the plurality of semiconductor devices includes top surfaces and bottom surfaces; forming a plurality of interconnects and coupling the plurality of interconnects to the package substrate, in which the plurality of interconnects are adjacent to the plurality of semiconductor devices; and forming a flyover bridge and coupling the flyover bridge to the plurality of semiconductor devices and the plurality of interconnects, in which the flyover bridge is directly coupled to the package substrate by the plurality of interconnects, and in which the bottom surfaces of the plurality of semiconductor devices are electrically isolated from the package substrate.

Example 9 may include the method of example 8 and/or any other example disclosed herein, further including: forming a mold layer on the package substrate, and disposing the plurality of semiconductor devices in the mold layer prior to positioning over the package substrate.

Example 10 may include the method of example 9 and/or any other example disclosed herein, in which the plurality of interconnects includes one or more metal members disposed in the mold layer, in which the plurality of semiconductor devices are separated by one metal member, and in which the package substrate is configured to transmit power to the plurality of semiconductor devices through the one or more metal members.

Example 11 may include the method of example 10 and/or any other example disclosed herein, in which the plurality of interconnects further includes a plurality of through-mold-vias, and the plurality of through-mold-vias are disposed in the mold layer, and in which the package substrate is configured to transmit signals to the plurality of semiconductor devices through the plurality of through-mold-vias.

Example 12 may include the method of example 10 and/or any other example disclosed herein, further including: forming a recess on the package substrate, in which the mold layer with the plurality of semiconductor devices and metal members are disposed in the recess.

Example 13 may include the method of example 12 and/or any other example disclosed herein, in which the plurality of interconnects further includes a plurality of package bumps, in which the plurality of package bumps are positioned adjacent to the mold layer.

Example 14 may include the method of example 10 and/or any other example disclosed herein, further including: forming a passive device disposed on a bottom surface of the package substrate, in which the passive device is coupled to the one or more metal members.

Example 15 may include a computing device including: a printed circuit board; and a semiconductor package coupled to the printed circuit board including: a package substrate; a plurality of semiconductor devices disposed on the package substrate, in which the plurality of semiconductor devices includes top surfaces and bottom surfaces; a plurality of interconnects coupled to the package substrate, in which the plurality of interconnects are adjacent to the plurality of semiconductor devices; and a flyover bridge coupled to the top surfaces of the plurality of semiconductor devices and the plurality of interconnects, in which the flyover bridge is directly coupled to the package substrate by the plurality of interconnects, and in which the bottom surfaces of the plurality of semiconductor devices are electrically isolated from the package substrate.

Example 16 may include the computing device of example 15 and/or any other example disclosed herein, further including: a mold layer disposed on the package substrate, in which the plurality of semiconductor devices are disposed in the mold layer.

Example 17 may include the computing device of example 16 and/or any other example disclosed herein, in which the plurality of interconnects includes one or more metal members disposed in the mold layer, in which the plurality of semiconductor devices are separated by one metal member, and in which the package substrate is configured to transmit power to the plurality of semiconductor devices through the one or more metal members.

Example 18 may include the computing device of example 17 and/or any other example disclosed herein, in which the plurality of interconnects further includes a plurality of through-mold-vias, and the plurality of through-mold-vias are embedded in the mold layer, and in which the package substrate is configured to transmit signals to the plurality of semiconductor devices through the plurality of through-mold-vias.

Example 19 may include the computing device of example 17 and/or any other example disclosed herein, further including: a recess on the package substrate, in which the mold layer with the plurality of semiconductor devices and metal members are disposed in the recess.

Example 20 may include the computing device of example 19 and/or any other example disclosed herein, in which the plurality of interconnects further includes a plurality of package bumps, and in which the plurality of package bumps are positioned adjacent to the mold layer.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific system or device may also hold for any system or device described herein. It will also be understood that any property described herein for a specific method may hold for any of the methods described herein. Furthermore, it will be understood that for any device, system, or method described herein, not necessarily all the components or operations described will be enclosed in the device, system, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
    a package substrate;
    a plurality of semiconductor devices, each comprising a top surface and a bottom surface, and wherein the bottom surface of each of the plurality of semiconductor devices is disposed on the package substrate;
    a plurality of interconnects coupled to the package substrate, wherein the plurality of interconnects are adjacent to the plurality of semiconductor devices; and
    a flyover bridge coupled to the top surfaces of the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate, a mold layer disposed on the package substrate, wherein the plurality of semiconductor devices is disposed in the mold layer;
    wherein the plurality of interconnects comprises one or more metal members disposed in the mold layer, wherein the plurality of semiconductor devices are separated by one metal member, and wherein the package substrate is configured to transmit power to the plurality of semiconductor devices through the one or more metal members.

2. The device of claim 1, wherein the plurality of interconnects further comprises a plurality of through-mold-vias, wherein the plurality of through-mold-vias are disposed in the mold layer, and wherein the package substrate is configured to transmit signals to the plurality of semiconductor devices through the plurality of through-mold-vias.

3. The device of claim 1, further comprising:
    a recess on the package substrate, wherein the mold layer with the plurality of semiconductor devices and metal members are disposed in the recess.

4. The device of claim 3, wherein the plurality of interconnects further comprises a plurality of package bumps, wherein the plurality of package bumps are positioned adjacent to the mold layer.

5. The device of claim 1, further comprising:
    a passive device disposed on a bottom surface of the package substrate, wherein the passive device is coupled to the one or more metal members.

6. The device of claim 1, wherein the package substrate comprises a first side and a second side, opposite the first side;
    further comprising a plurality of solder balls, configured to connect the device to a motherboard, and mounted to the first side of the package substrate;
    wherein the bottom surfaces of the plurality of semiconductor devices are mounted to the second side of the package substrate;
    wherein the flyover bridge is mounted on the top surface of the plurality of semiconductor devices.

7. A method comprising:
    providing a package substrate;
    positioning a plurality of semiconductor devices, each comprising a top surface and a bottom surface, and wherein the bottom surface of each of the plurality of semiconductor devices is disposed on the package substrate;
    forming a plurality of interconnects and coupling the plurality of interconnects to the package substrate, wherein the plurality of interconnects are adjacent to the plurality of semiconductor devices; and
    forming a flyover bridge and coupling the flyover bridge to the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate;
    providing a mold layer disposed on the package substrate, wherein the plurality of semiconductor devices is disposed in the mold layer;
    wherein the plurality of interconnects comprises one or more metal members disposed in the mold layer, wherein the plurality of semiconductor devices are separated by one metal member, and wherein the package substrate is configured to transmit power to the plurality of semiconductor devices through the one or more metal members.

8. The method of claim 7, further comprising:
    forming a mold layer on the package substrate, and disposing the plurality of semiconductor devices in the mold layer prior to positioning over the package substrate.

9. The method of claim 8, wherein the plurality of interconnects comprises one or more metal members disposed in the mold layer, wherein the plurality of semiconductor devices are separated by one metal member, and wherein the package substrate is configured to transmit power to the plurality of semiconductor devices through the one or more metal members.

10. The method of claim 9, wherein the plurality of interconnects further comprises a plurality of through-mold-vias, and the plurality of through-mold-vias are disposed in the mold layer, and wherein the package substrate is configured to transmit signals to the plurality of semiconductor devices through the plurality of through-mold-vias.

11. The method of claim 9, further comprising:
forming a recess on the package substrate, wherein the mold layer with the plurality of semiconductor devices and metal members are disposed in the recess.

12. The method of claim 11, wherein the plurality of interconnects further comprises a plurality of package bumps, wherein the plurality of package bumps are positioned adjacent to the mold layer.

13. The method of claim 9, further comprising:
forming a passive device disposed on a bottom surface of the package substrate, wherein the passive device is coupled to the one or more metal members.

14. A computing device comprising:
a printed circuit board; and
a semiconductor package coupled to the printed circuit board comprising:
a package substrate;
a plurality of semiconductor devices, each comprising a top surface and a bottom surface, and wherein the bottom surface of each of the plurality of semiconductor devices is disposed on the package substrate;
a plurality of interconnects coupled to the package substrate, wherein the plurality of interconnects are adjacent to the plurality of semiconductor devices; and
a flyover bridge coupled to the top surfaces of the plurality of semiconductor devices and the plurality of interconnects, wherein the flyover bridge is directly coupled to the package substrate by the plurality of interconnects, and wherein the bottom surfaces of the plurality of semiconductor devices are electrically isolated from the package substrate; a mold layer disposed on the package substrate, wherein the plurality of semiconductor devices is disposed in the mold layer;
wherein the plurality of interconnects comprises one or more metal members disposed in the mold layer, wherein the plurality of semiconductor devices are separated by one metal member, and wherein the package substrate is configured to transmit power to the plurality of semiconductor devices through the one or more metal members.

15. The computing device of claim 14, wherein the plurality of interconnects further comprises a plurality of through-mold-vias, and the plurality of through-mold-vias are embedded in the mold layer, and wherein the package substrate is configured to transmit signals to the plurality of semiconductor devices through the plurality of through-mold-vias.

16. The computing device of claim 14, further comprising:
a recess on the package substrate, wherein the mold layer with the plurality of semiconductor devices and metal members are disposed in the recess.

17. The computing device of claim 16, wherein the plurality of interconnects further comprises a plurality of package bumps, and wherein the plurality of package bumps are positioned adjacent to the mold layer.

* * * * *